(12) United States Patent
Bellers

(10) Patent No.: US 8,446,530 B2
(45) Date of Patent: May 21, 2013

(54) DYNAMIC SAMPLING

(75) Inventor: Erwin B. Bellers, South Salem, NY (US)

(73) Assignee: Entropic Communications, Inc., San Diego, CA (US)

( * ) Notice: Subject to any disclaimer, the term of this patent is extended or adjusted under 35 U.S.C. 154(b) by 2675 days.

(21) Appl. No.: 09/966,038

(22) Filed: Sep. 28, 2001

(65) Prior Publication Data

US 2003/0063219 A1   Apr. 3, 2003

(51) Int. Cl.
*H03M 1/12* (2006.01)

(52) U.S. Cl.
USPC .......................................... 348/572; 348/571

(58) Field of Classification Search
USPC .............. 348/571–572, 441; 341/130, 132, 341/133, 134, 135–140, 110
IPC ............................................. H03M 1/12
See application file for complete search history.

(56) References Cited

U.S. PATENT DOCUMENTS

| | | | |
|---|---|---|---|
| 3,324,237 A | 6/1967 | Cherry et al. ............ 178/6 |
| 4,496,937 A * | 1/1985 | Kitagawa et al. ............ 341/110 |
| 4,626,827 A * | 12/1986 | Kitamura et al. ............ 341/110 |
| 4,755,795 A * | 7/1988 | Page ................ 341/51 |
| 4,763,207 A * | 8/1988 | Podolak et al. ............ 360/32 |
| 4,816,829 A | 3/1989 | Podolak et al. |
| 5,148,270 A | 9/1992 | Someya ............ 358/133 |
| 5,150,207 A | 9/1992 | Someya ............ 358/133 |
| 5,302,950 A * | 4/1994 | Johnson et al. ............ 341/123 |
| 5,576,837 A | 11/1996 | Strolle et al. ............ 386/33 |
| 5,612,748 A | 3/1997 | Gohshi et al. ............ 348/424 |
| 5,666,386 A | 9/1997 | Masuda |
| 5,841,387 A | 11/1998 | Van Buskirk |
| 6,473,008 B2 * | 10/2002 | Kelly et al. ............ 341/61 |

FOREIGN PATENT DOCUMENTS

| | | |
|---|---|---|
| EP | 0259004 A1 | 3/1988 |
| EP | 1146323 A1 | 10/2001 |
| JP | 63243882 A | 10/1988 |

* cited by examiner

*Primary Examiner* — Trang U Tran
(74) *Attorney, Agent, or Firm* — Bruce Greenhaus; Richard Bachand; Duane Morris LLP

(57) ABSTRACT

A sampling system adapts the sampling rate for sampling analog signals and/or the stored number of samples to the fixed or video image content, such that a higher rate, and equivalently a larger number of samples, are acquired for an image or video segment containing higher spatial frequencies while a lower number of samples (lower sampling rate) are retained for image or video segments containing lower spatial frequencies. The Nyquist theorem may still be satisfied for each individual image segment, while information necessary for edge enhancement is retained.

20 Claims, 3 Drawing Sheets

DYNAMIC SAMPLING

TECHNICAL FIELD OF THE INVENTION

The present invention is directed, in general, to processing video signals and, more specifically, to digital sampling of video signals.

BACKGROUND OF THE INVENTION

The spatial frequency or frequencies of an image are the rates of pixel change per unit distance, usually expressed in cycles per degree or radian. For horizontal sampling of the gratings depicted in FIG. 3, for example, sine wave varying regions 300 and 301 both have a single spatial frequency, although the spatial frequency for region 301 is lower than the spatial frequency for region 300. Square wave varying region 302 has a number of spatial frequencies, with the lowest spatial frequency for the region 302 equal to the sole spatial frequency for region 301. Fourier analysis of image samples allows the spatial frequency or frequencies of an image to be identified.

Current digital image/video systems are designed to employ a fixed sampling frequency of at least twice the highest spatial frequency within the image (Nyquist theorem). The number of samples which are used and/or stored for an image may be reduced by sub-sampling, but such sub-sampling is not modulated by the image or video content. Moreover, while the Nyquist theorem is occasionally violated during sampling, the sampling frequency typically remains predefined and constant.

If the Nyquist theorem is met during sampling, all spatial frequencies for the sampled image are theoretically preserved. In practice, of course, uncertainties increase due to noise, with the result that reproduction of the original high spatial frequencies becomes more difficult or even impossible. Noise reduction algorithms attempt to improve recovery, which remains difficult for the highest frequencies.

There is, therefore, a need in the art for adapting the sampling frequency or sampling density according to the image or video content being sampled.

SUMMARY OF THE INVENTION

To address the above-discussed deficiencies of the prior art, it is a primary object of the present invention to provide, for use in a video receiver, a sampling system which adapts the sampling rate for sampling analog signals and/or the stored number of samples to the fixed or video image content, such that a higher rate, and equivalently a larger number of samples, are acquired for an image or video segment containing higher spatial frequencies while a lower number of samples (lower sampling rate) are retained for image or video segments containing lower spatial frequencies. The Nyquist theorem may still be satisfied for each individual image segment, while information necessary for edge enhancement is retained.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 and 2A-2C, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
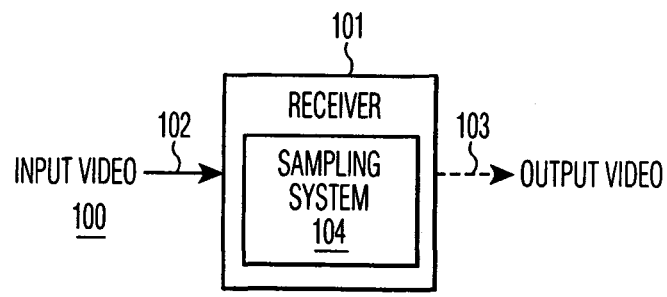
FIG. 1 depicts a video system with sampling based upon spatial frequencies of the video image content according to one embodiment of the present invention.

FIG. 1 depicts a video system with sampling based upon spatial frequencies of the video image content according to one embodiment of the present invention. In the exemplary embodiment, the video system 100 is implemented within a video receiver 101 having an input 102 receiving an analog video signal and optionally an output 103 for transmitting digital video data corresponding to the received analog video to a display, a storage device or system, or another device.

Receiver 101 may be a digital television (DTV) having a digital display, a satellite, terrestrial, or cable broadcast receiver for connection to a television, or the like. The present invention may also be employed for any receiver such as, for example, a broadband wireless Internet access receiver or any other video device receiving analog video information such as a video cassette recorder (VCR), a digital video recorder, or a digital versatile disk (DVD) player. Regardless of the embodiment, however, receiver 101 employs content-dependent frequency of sampling or sample density within the resulting digital signal as described in further detail below.

Those skilled in the art will perceive that FIG. 1 does not explicitly depict every component within a receiver system. Only those portions of such a system that are unique to the present invention and/or required for an understanding of the structure and operation of the present invention are shown.

Receiver 101 includes a sampling mechanism 104 which samples the analog video input signal at a frequency modulated by or dependent upon the spatial frequency of the sampled content. A higher sampling frequency (larger sampling density) is employed for image content having higher spatial frequencies and a lower sampling rate is employed for image content having lower spatial frequencies. The Nyquist theorem may still be satisfied, with the sampling frequency set to twice the highest spatial frequency within the content being sampled.

The result, as compared to fixed frequency sampling, is fewer samples for content having low spatial frequencies and more samples for image content having high spatial frequencies. If noise deteriorates the image or video, the larger number of samples for regions having higher spatial frequencies, mainly edges, help to preserve the original edge significantly better than fixed sampling rates. The additional samples are often necessary for many sharpness enhancement algorithms.

Figure 2A:
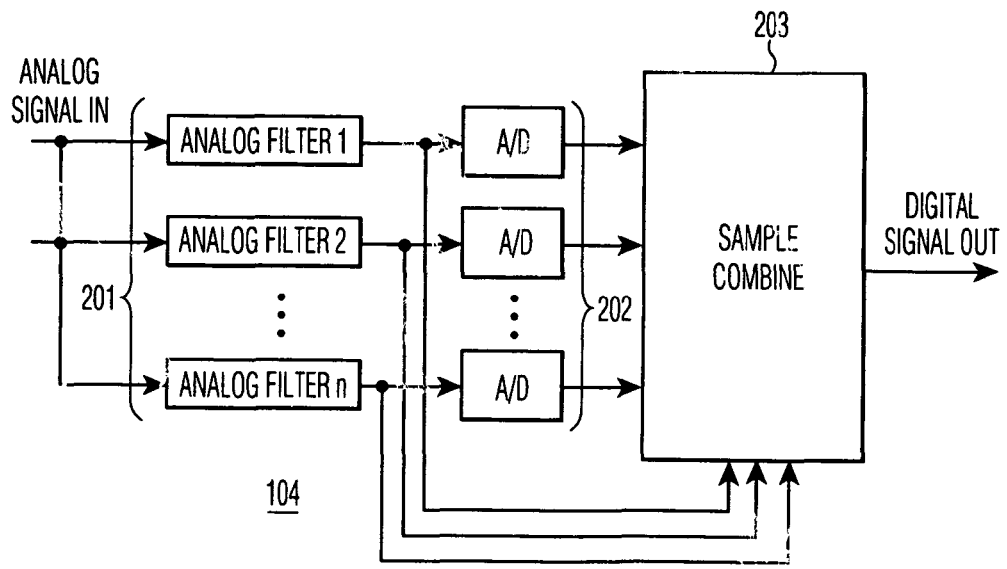
FIGS. 2A through 2C are diagrams of sampling mechanisms for image sampling based upon spatial frequencies of the video image content according to various embodiment of the present invention.
Figure 2B:
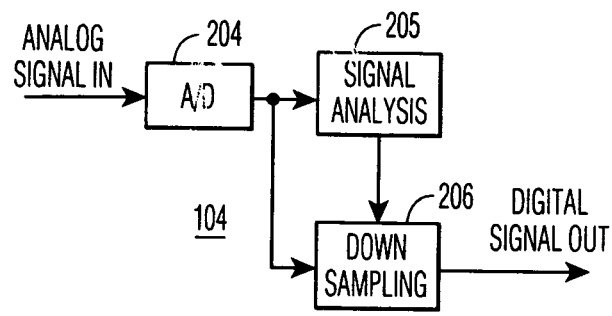
Figure 2C:
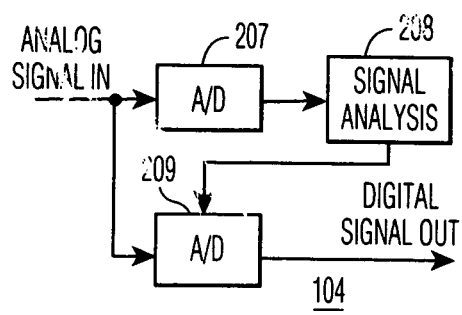
Figure 3:
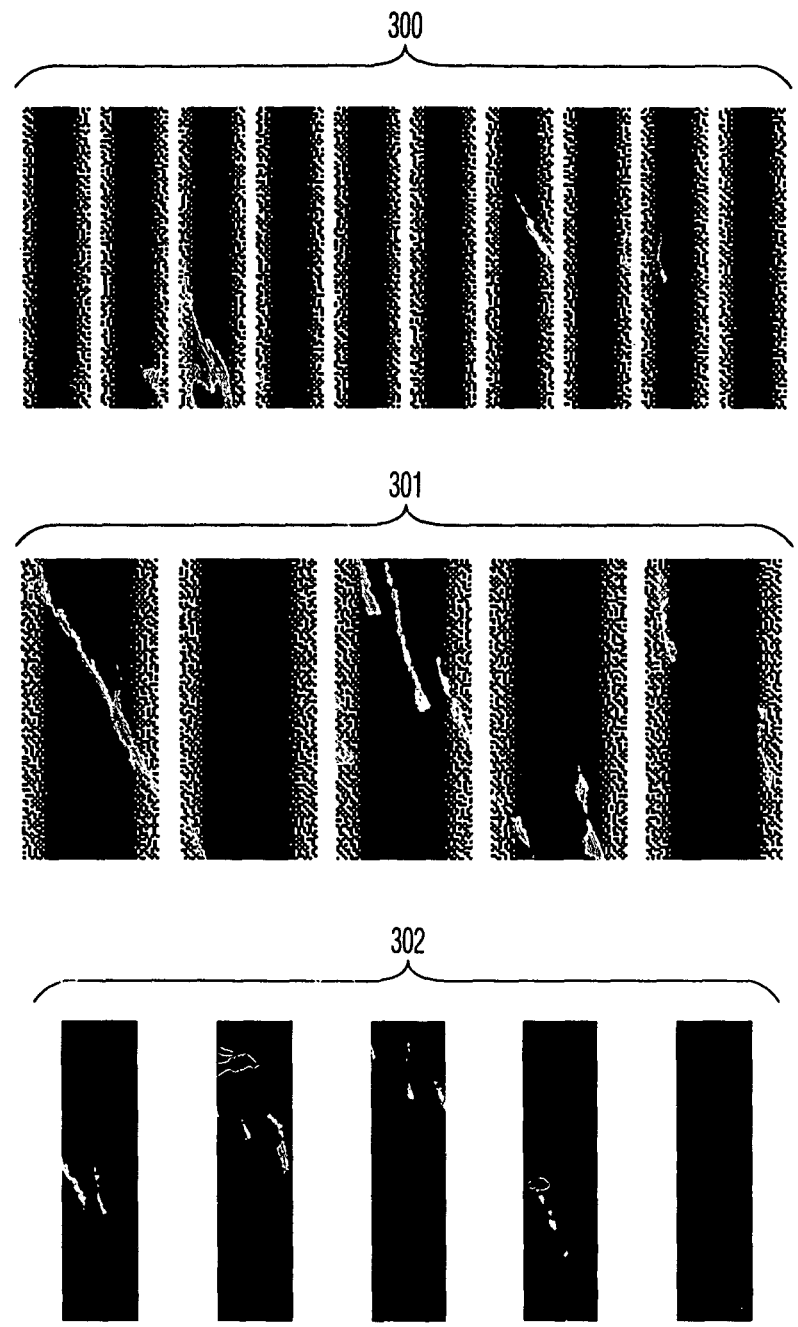
FIG. 3 depicts gratings for image content having various spatial frequencies.

FIGS. 2A through 2C are diagrams of sampling mechanisms for image sampling based upon spatial frequencies of the video image content according to various embodiment of the present invention. In the embodiment of FIG. 2A, a number n (where n is any positive, nonzero integer) of analog filters 201 are employed by smapling mechanism 104 to separate the input signal's frequency spectrum. Each analog filter 201 filters the input signal for a specific band of spatial frequencies. A number of corresponding analog-to-digital (A/D) converters 202 each having different settings for the various filtered signals are employed to generate different digital representations having different sampling rates. An intelligent sample combination mechanism 203 receiving both the output of filters 201 and the corresponding digital representations from converters 202 selects an output from one of converters 202 for each input signal segment and combines the selected representations to form the digital output signal.

In the embodiment of FIG. 2B, sampling mechanism 104 includes a single analog-to-digital converter 204 employing a high, fixed sampling rate. The sampled input signal is then analyzed by signal analysis unit 205 to determine the highest spatial frequency within the sample image data. Signal analysis unit 205 controls a downsampling unit 206 which receives the input samples to reduce the number of samples retained at image or video parts having low spatial frequencies and retain the high number of samples for image content having high spatial frequencies. The number of samples retained for a particular image segment may be related to the Nyquist theorem and the highest spatial frequency detected within the sampled image content.

In the embodiment of FIG. 2C, sampling mechanism 104 includes a first analog-to-digital converter 207 employing a fixed sample rate equal to the highest sampling rate supported. A signal analysis unit 208 analyzes the spatial frequencies within the sampled samples, then modulates the variable sampling rate employed by a second analog-to-digital converter 209 based upon the sampled content. A buffer (not shown) may be employed to correlate the sampling rate to the content being sampled. An initial sampling rate for converter 209 is employed, with the sampling rate being increased during sampling when the sampled content's spatial frequencies are high (e.g., close to the chosen Nyquist frequency for the current sampling rate) and is otherwise lowered. Image segments which are determined to have been sampled at too low a rate may be resampled at a higher sampling rate.

In each of the embodiments of FIGS. 2A-2C, the number of samples or the size of the input segment for which the sampling rate is adjusted may be either fixed or variable. Optimization of sample density for various segment lengths may be determined by considered all permutations.

The present invention employs a sampling rate which is modulated based upon the spatial frequencies of the content being sampled. Higher sampling rates, and larger sample densities, are employed for content having high spatial frequencies while lower sampling rates are employed for content having low spatial frequencies. The Nyquist theorem may still be satisfied for particular segments of image data, and the necessary information for edge enhancement is retained. The resulting samples are suitable for image standards employing run-length encoding (RLE), such as the motion picture experts group (MPEG) standard.

It is important to note that while the present invention has been described in the context of a fully functional receiver, those skilled in the art will appreciate that at least portions of the mechanism of the present invention is capable of being distributed in the form of a machine usable medium containing instructions in a variety of forms, and that the present invention applies equally regardless of the particular type of signal bearing medium utilized to actually carry out the distribution. Examples of machine usable mediums include: nonvolatile, hard-coded type mediums such as read only memories (ROMs) or erasable, electrically programmable read only memories (EEPROMs), recordable type mediums such as floppy disks, hard disk drives and compact disc read only memories (CD-ROMs) or digital versatile discs (DVDs), and transmission type mediums such as digital and analog communication links.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A system for dynamic sampling comprising: an input receiving an analog video signal; and a sampling mechanism coupled to the input and sampling the analog video signal utilizing a variable sampling rate modulated for segments of the analog video signal based upon spatial frequencies within the image content contained within the analog video signal; an output of said sampling mechanism being coupled to a signal analysis unit to determine a highest spatial frequency within the image content; and said variable sampling rate being adjustable both upward and downward over a continuous range as a function of the highest spatial frequency within the image content.

2. The system as set forth in claim 1 wherein a first sampling rate is employed for a first segment of the analog video signal containing content having a first highest spatial frequency and a second sampling rate greater than the first sampling rate is employed for a segment of the analog video signal containing content having a second highest spatial frequency greater than the first highest spatial frequency.

3. The system as set forth in claim 2 wherein the sampling mechanism further comprises: a plurality of analog filters each receiving the analog video signal; a plurality of analog-to-digital converters each coupled to one of the plurality of analog filters and having settings based upon the corresponding analog filter, each analog-to-digital converter sampling an output of the corresponding analog filter; and combination logic selecting the output of one of the analog-to-digital converters for each segment of the analog video signal and combining the selected outputs.

4. The system as set forth in claim 2 wherein the sampling mechanism further comprises: a single analog-to-digital converter receiving the analog video signal and sampling the analog video signal at a fixed rate; a signal analysis unit analyzing samples from the converter to select a sampling rate for each segment of the analog video signal; and a downsampling unit retaining samples from the converter for each segment of the analog video signal based upon the corresponding sampling rate selected by the signal analysis unit.

5. The system as set forth in claim 2 wherein the sampling mechanism further comprises: a first analog-to-digital converter receiving the analog video signal and sampling the analog video signal at a fixed rate sufficient to detect all spatial frequencies of interest within the content contained within the analog video signal; a second analog-to-digital converter receiving the analog video signal and sampling the analog video signal at a variable rate; and a signal analysis unit analyzing samples from the first converter to select a sampling rate for each segment of the analog video signal and adjusting the sampling rate of the second converter.

6. The system as set forth in claim 2 wherein the sampling rate for each segment of the analog video signal is at least twice a highest spatial frequency within content contained by the corresponding segment of the analog video signal.

7. The system as set forth in claim 2 wherein the sampling mechanism samples the analog video signal at a first rate and transmits samples for at least one segment of the analog video signal at second rate different than the first rate.

8. A video receiver comprising: an input receiving an analog video signal; an output transmitting a digital video signal to a display, a storage system, or another device; and a sampling mechanism coupled to the input and sampling the analog video signal utilizing a variable sampling rate modulated for segments of the analog video signal based upon spatial frequencies within the image content contained within the analog video signal; an output of said sampling mechanism being coupled to a signal analysis unit to determine a highest spatial frequency within the image content; and said variable sampling rate being adjustable both upward and downward over a continuous range as a function of the highest spatial frequency within the image content.

9. The video receiver as set forth in claim 8 wherein a first sampling rate is employed for a first segment of the analog video signal containing content having a first highest spatial frequency and a second sampling rate greater than the first sampling rate is employed for a segment of the analog video signal containing content having a second highest spatial frequency greater than the first highest spatial frequency.

10. The video receiver as set forth in claim 9 wherein the sampling mechanism further comprises: a plurality of analog filters each receiving the analog video signal; a plurality of analog-to-digital converters each coupled to one of the plurality of analog filters and having settings based upon the corresponding analog filter, each analog-to-digital converter sampling an output of the corresponding analog filter; and combination logic selecting the output of one of the analog-to-digital converters for each segment of the analog video signal and combining the selected outputs.

11. The video receiver as set forth in claim 9 wherein the sampling mechanism further comprises: a single analog-to-digital converter receiving the analog video signal and sampling the analog video signal at a fixed rate; a signal analysis unit analyzing samples from the converter to select a sampling rate for each segment of the analog video signal; and a downsampling unit retaining samples from the converter for each segment of the analog video signal based upon the corresponding sampling rate selected by the signal analysis unit.

12. The video receiver as set forth in claim 9 wherein the sampling mechanism further comprises: a first analog-to-digital converter receiving the analog video signal and sampling the analog video signal at a fixed rate sufficient to detect all spatial frequencies of interest within the content contained within the analog video signal; a second analog-to-digital converter receiving the analog video signal and sampling the analog video signal at a variable rate; and a signal analysis unit analyzing samples from the first converter to select a sampling rate for each segment of the analog video signal and adjusting the sampling rate of the second converter.

13. The video receiver as set forth in claim 9 wherein the sampling rate for each segment of the analog video signal is at least twice a highest spatial frequency within content contained by the corresponding segment of the analog video signal.

14. The video receiver as set forth in claim 9 wherein the sampling mechanism samples the analog video signal at a first rate and transmits samples for at least one segment of the analog video signal at second rate different than the first rate.

15. A method dynamic sampling comprising: receiving an analog video signal; sampling the analog video signal utilizing a variable sampling rate modulated for segments of the analog video signal based upon spatial frequencies within the image content contained within the analog video signal; determining a highest spatial frequency within the image content; and adjusting the variable sample rate both upward and downward over a continuous range as a function of the highest spatial frequency within the image content.

16. The method as set forth in claim 15 wherein a first sampling rate is employed for a first segment of the analog video signal containing content having a first highest spatial frequency and a second sampling rate greater than the first sampling rate is employed for a segment of the analog video signal containing content having a second highest spatial frequency greater than the first highest spatial frequency.

17. The method as set forth in claim 16 further comprising: receiving the analog video signal at each of a plurality of analog filters; sampling an output of each analog filter utilizing an analog-to-digital converter coupled to the corresponding analog filter and having settings based upon the corresponding analog filter; and selecting the output of one of the analog-to-digital converters for each segment of the analog video signal and combining the selected outputs.

18. The method as set forth in claim 16 further comprising: receiving the analog video signal at a single analog-to-digital converter sampling the analog video signal at a fixed rate; analyzing samples from the converter to select a sampling rate for each segment of the analog video signal; and retaining samples from the converter for each segment of the analog video signal based upon the corresponding selected sampling rate.

19. The method as set forth in claim 16 further comprising: receiving the analog video signal at a first analog-to-digital converter sampling the analog video signal at a fixed rate sufficient to detect all spatial frequencies of interest within the content contained within the analog video signal; receiving the analog video signal at a second analog-to-digital converter sampling the analog video signal at a variable rate; and analyzing samples from the first converter to select a sampling rate for each segment of the analog video signal and adjusting the sampling rate of the second converter.

20. The method as set forth in claim 16 wherein the sampling rate for each segment of the analog video signal is at least twice a highest spatial frequency within content contained by the corresponding segment of the analog video signal.

\* \* \* \* \*